US012633934B2

(12) United States Patent
Wang et al.

(10) Patent No.: US 12,633,934 B2
(45) Date of Patent: May 19, 2026

(54) ADAPTIVE CURRENT GENERATION CIRCUIT AND METHOD APPLIED TO INPUT BUFFER OF HIGH-SPEED ADC

(71) Applicant: Chongqing GigaChip Technology Co., Ltd., Chongqing (CN)

(72) Inventors: Yizhou Wang, Chongqing (CN); Lu Liu, Chongqing (CN); Daiguo Xu, Chongqing (CN); Can Zhu, Chongqing (CN); Hequan Jiang, Chongqing (CN); Ruzhang Li, Chongqing (CN); Jianan Wang, Chongqing (CN); Guangbing Chen, Chongqing (CN); Dongbing Fu, Chongqing (CN); Zhou Yu, Chongqing (CN); Zhengping Zhang, Chongqing (CN)

(73) Assignee: Chongqing GigaChip Technology Co., Ltd., Chongqing (CN)

( * ) Notice: Subject to any disclaimer, the term of this patent is extended or adjusted under 35 U.S.C. 154(b) by 214 days.

(21) Appl. No.: 18/650,065

(22) Filed: Apr. 29, 2024

(65) Prior Publication Data

US 2024/0281015 A1     Aug. 22, 2024

Related U.S. Application Data

(63) Continuation of application No. PCT/CN2022/080566, filed on Mar. 14, 2022.

(30) Foreign Application Priority Data

Mar. 2, 2022     (CN) .......................... 202210204295.9

(51) Int. Cl.
| | |
|---|---|
| *H03M 1/12* | (2006.01) |
| *H03M 1/00* | (2006.01) |
| *G05F 3/26* | (2006.01) |

(52) U.S. Cl.
CPC ............. *H03M 1/002* (2013.01); *H03M 1/12* (2013.01); *G05F 3/26* (2013.01)

(58) Field of Classification Search
CPC ........... H03M 1/002; H03M 1/12; G05F 3/26
See application file for complete search history.

(56) References Cited

U.S. PATENT DOCUMENTS

| | | | | |
|---|---|---|---|---|
| 5,324,995 | A * | 6/1994 | Yee ........................... | H03K 5/08 327/91 |
| 6,573,762 | B1 * | 6/2003 | Wessendorf ........... | G06G 7/161 327/91 |

(Continued)

FOREIGN PATENT DOCUMENTS

| | | |
|---|---|---|
| CN | 101090271 A | 12/2007 |
| CN | 109656304 A | 4/2019 |

*Primary Examiner* — Gary L Laxton

(57) ABSTRACT

An adaptive current generation circuit includes an inverter drive chain, a frequency divider, a frequency detector, a low-pass filter, a static comparator group, and a controllable current mirror. An input analog signal of the input buffer is converted into a frequency discrimination voltage in a direct current form sequentially through conversion of the inverter drive chain, frequency division of the frequency divider, frequency detection of the frequency detector, and conversion of the low-pass filter. Then the static comparator group performs a plurality of times of comparison to obtain N bits of digital codes. Finally, the controllable current mirror is controlled by using the N bits of digital codes. The controllable current mirror provides a magnitude-adjustable input current for the input buffer under control of the N bits of digital codes. A magnitude of the input current is positively correlated with a frequency of the input analog signal.

10 Claims, 6 Drawing Sheets

(56)         References Cited

U.S. PATENT DOCUMENTS

| | | | |
|---|---|---|---|
| 7,279,960 B1 * | 10/2007 | Lee | G05F 3/242<br>327/538 |
| 7,535,272 B1 * | 5/2009 | Kwong | H03L 7/0891<br>375/376 |
| 2006/0125535 A1 * | 6/2006 | Caplan | H03L 7/0898<br>327/156 |
| 2008/0111588 A1 | 5/2008 | Kim | |
| 2008/0310573 A1 * | 12/2008 | Lewis | H04L 27/12<br>375/376 |
| 2011/0188619 A1 * | 8/2011 | Sugioka | G06F 1/10<br>375/354 |
| 2011/0210878 A1 | 9/2011 | Barrow | |
| 2011/0215875 A1 * | 9/2011 | Yagishita | H03L 7/099<br>331/34 |
| 2012/0056769 A1 * | 3/2012 | Wang | G04F 10/005<br>341/166 |
| 2013/0058437 A1 * | 3/2013 | Oshima | H03M 1/0836<br>341/166 |
| 2014/0085123 A1 * | 3/2014 | Roytman | H03M 1/126<br>341/158 |
| 2014/0253352 A1 * | 9/2014 | Oshima | H03M 1/1038<br>341/118 |
| 2016/0344352 A1 * | 11/2016 | Chang | H03F 1/34 |
| 2018/0212611 A1 * | 7/2018 | Shen | H03L 3/00 |
| 2020/0112316 A1 * | 4/2020 | Fujita | H03L 7/099 |
| 2021/0091784 A1 * | 3/2021 | Tseng | H03L 7/099 |

* cited by examiner

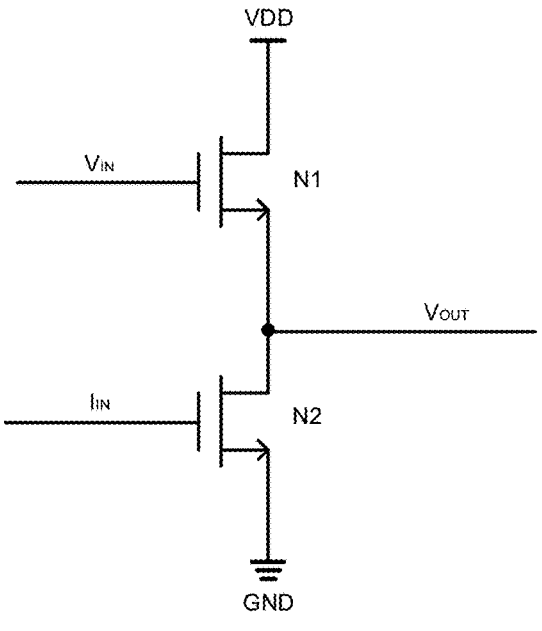
Prior Art FIG. 1
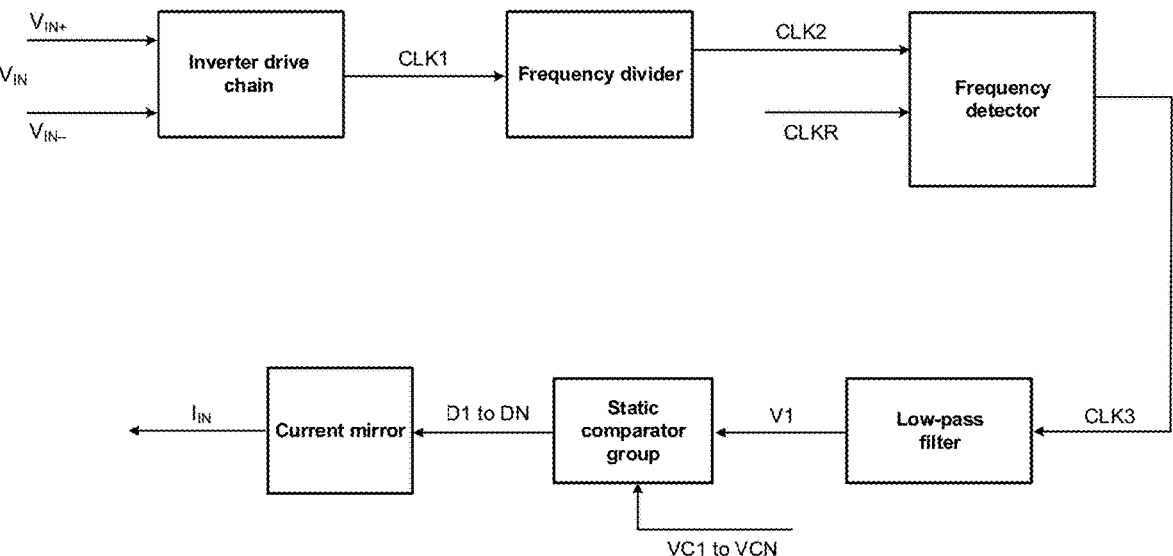
FIG. 2

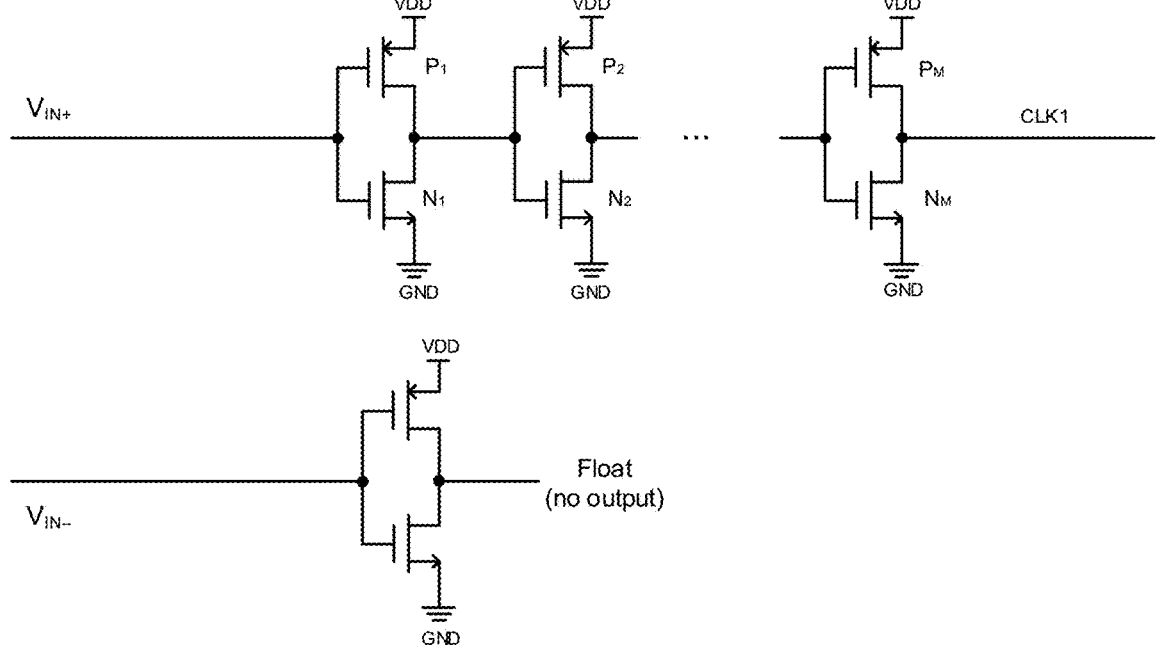
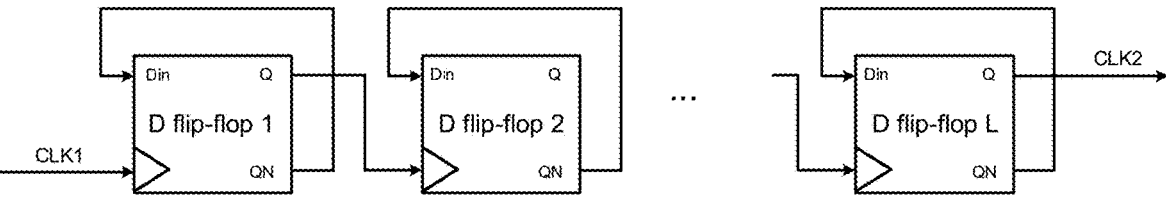
FIG. 3
FIG. 4

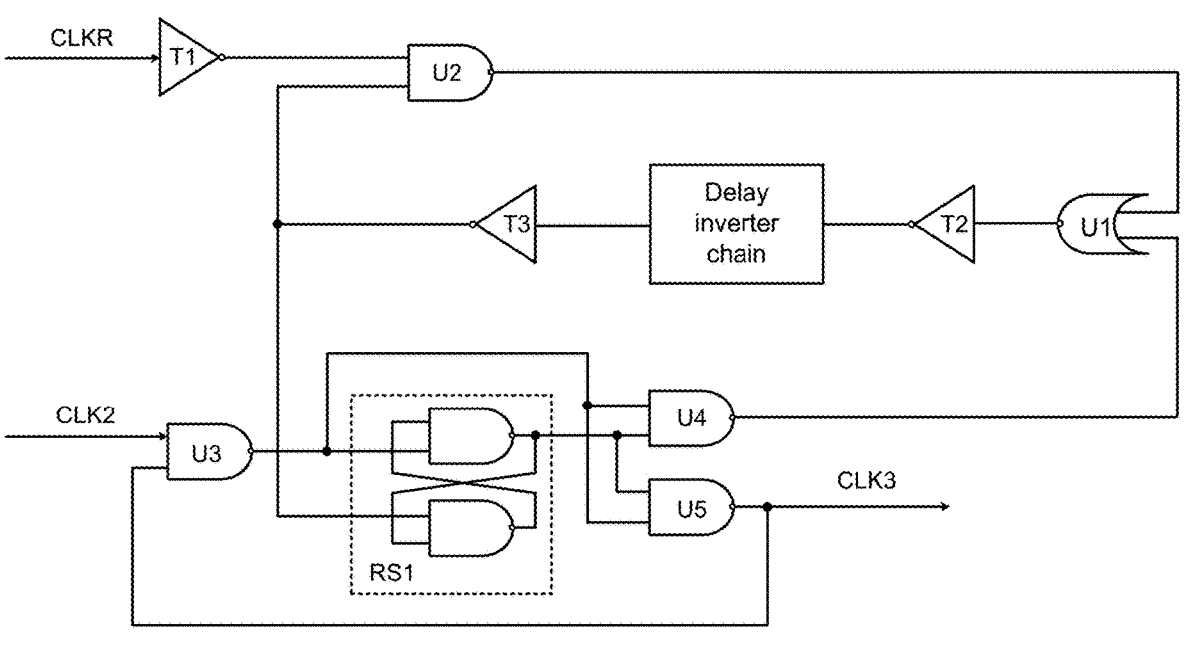
FIG. 5
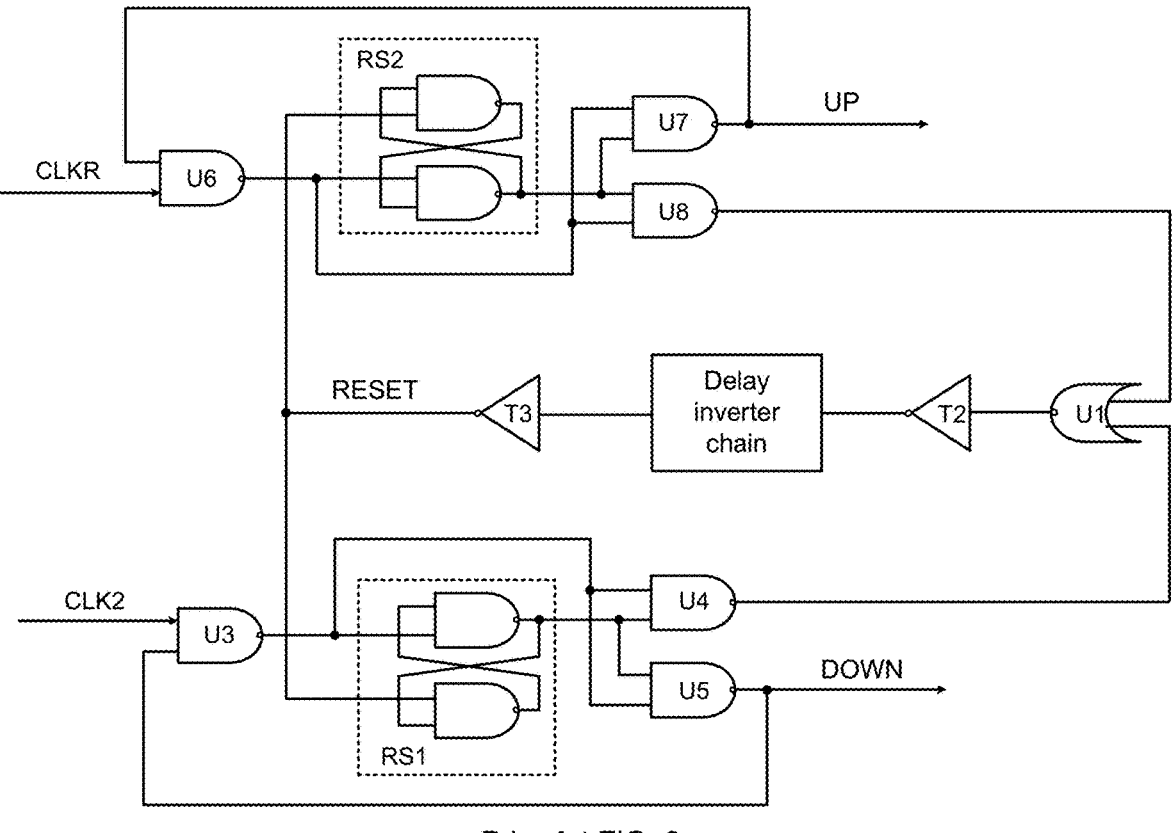
Prior Art FIG. 6

ADAPTIVE CURRENT GENERATION CIRCUIT AND METHOD APPLIED TO INPUT BUFFER OF HIGH-SPEED ADC

CROSS REFERENCE TO RELATED APPLICATION

The present application is a continuation application of PCT Application No. PCT/CN2022/080566, filed on Mar. 14, 2022, which claims the benefit of priority to a Chinese Patent Application number CN202210204295.9, filed on Mar. 2, 2022, the disclosure of the above application is hereby incorporated by reference in its entirety for all purposes.

TECHNICAL FIELD

The present disclosure relates to the field of integrated circuit technologies, and in particular, to an adaptive current generation circuit and method applied to an input buffer of a high-speed ADC.

BACKGROUND

An ultra-high-speed analog-to-digital converter (ADC) usually processes an input analog signal by using an input buffer, and then outputs a processed signal to an internal core circuit of the ADC, to suppress impact of a parasitic capacitance and inductance of packaging on performance of the ADC and enhance a driving capability of the input signal, so that the input signal can be better sampled by a sampling circuit.

A basic structure of the input buffer is usually a source follower, and therefore, performance of the input buffer is closely related to a magnitude of a current of the input buffer. When a frequency of the input signal is low, only a small current of the input buffer is needed to achieve good dynamic performance (that is, a spurious-free dynamic range of an output signal meets a requirement of the ADC); and when the frequency of the input signal is high (near or above half of a sampling frequency), the current of the input buffer needs to be large to meet the performance requirement.

In a conventional input buffer, a large current is usually directly used as a current of the input buffer. In this case, power consumption is wasted when a frequency of an input signal is low, and dynamic performance is degraded due to an offset of a quiescent operating point compared with that in the case of a small current. In some input buffers, manual adjustment is performed to avoid this problem, that is, a user adjusts a magnitude of a current based on a frequency of an input signal. However, this increases the difficulty of use. Therefore, it is inconvenient for the user to use the input buffer, and practicality is affected.

SUMMARY

The present disclosure is intended to provide an adaptive current generation technical solution applied to an input buffer of a high-speed ADC. An input current of the input buffer is automatically adjusted based on a frequency of an input analog signal of the input buffer, to avoid a waste of power consumption caused by an excessively large input current and performance degradation caused by an excessively large input current or an excessively small input current.

The present disclosure provides the following technical solutions:

An adaptive current generation circuit applied to an input buffer of a high-speed ADC is provided, and includes:

an inverter drive chain, configured to collect an input analog signal of the input buffer, and convert the input analog signal into a first clock signal;

a frequency divider, configured to receive the first clock signal, and perform frequency division processing on the first clock signal to obtain a second clock signal;

a frequency detector, configured to receive a reference clock signal and the second clock signal, and perform frequency detection on the second clock signal to obtain a frequency discrimination output signal;

a low-pass filter, configured to receive the frequency discrimination output signal, and convert the frequency discrimination output signal into a frequency discrimination voltage in a direct current form;

a static comparator group, configured to receive the frequency discrimination voltage and N reference voltages having different magnitudes, and separately compare the frequency discrimination voltage with the N reference voltages to obtain N bits of digital codes; and a controllable current mirror, configured to receive the N bits of digital codes, and provide a magnitude-adjustable input current for the input buffer under control of the N bits of digital codes, where N is an integer greater than or equal to 2.

In exemplary embodiments, the inverter drive chain includes:

a first inverting unit, connected to one terminal of the input analog signal, and configured to perform inverting M consecutive times to obtain and output the first clock signal; and a second inverting unit, connected to the other terminal of the input analog signal, and configured to perform inverting once, to be floating(suspended) without output, where M is an integer greater than or equal to 2.

In exemplary embodiments, the first inverting unit includes M sequentially cascaded CMOS inverters, and the second inverting unit includes one CMOS inverter.

In exemplary embodiments, in the first inverting unit, width to length ratios of NMOS transistors in the M sequentially cascaded CMOS inverters are distributed in a geometric progression by using S as a common ratio, and width to length ratios of PMOS transistors in the M sequentially cascaded CMOS inverters are distributed in a geometric progression by using S as a common ratio, where S is an integer greater than or equal to 2.

In exemplary embodiments, the frequency divider includes L sequentially cascaded D flip-flops, a forward output terminal of an $i^{th}$ D flip-flop is connected to a clock terminal of an $(i+1)^{th}$ D flip-flop, a reverse output terminal of a $j^{th}$ D flip-flop is connected to an input terminal of the $j^{th}$ D flip-flop, a clock terminal of the first D flip-flop is connected to the first clock signal, and a forward output terminal of an Lth D flip-flop outputs the second clock signal, where L is an integer greater than or equal to 2, i is an integer ranging from 1 to L−1, and j is an integer ranging from 1 to L.

In exemplary embodiments, a frequency of the second clock signal is less than or equal to half of a frequency of the reference clock signal.

In exemplary embodiments, the frequency detector includes a first inverter, a second inverter, a third inverter, a delay inverter chain, a NOR gate, a first NAND gate, a second NAND gate, a third NAND gate, a fourth NAND gate, and an RS flip-flop, an input terminal of the first inverter is connected to the reference clock signal, an output terminal of the first inverter is connected to a first input terminal of the first NAND gate, an output terminal of the first NAND gate is connected to a first input terminal of the NOR gate, an output terminal of the NOR gate is connected to a second input terminal of the first NAND gate through the second inverter, the delay inverter chain, and the third inverter that are sequentially connected in series, a first input terminal of the second NAND gate is connected to the second clock signal, an output terminal of the second NAND gate is connected to a direct-set terminal of the RS flip-flop, the output terminal of the second NAND gate is further connected to a first input terminal of the third NAND gate and a first input terminal of the fourth NAND gate, a direct-reset terminal of the RS flip-flop is connected to the second input terminal of the first NAND gate, a forward output terminal of the RS flip-flop is connected to a second input terminal of the third NAND gate, an output terminal of the third NAND gate is connected to a second input terminal of the NOR gate, the forward output terminal of the RS flip-flop is further connected to a second input terminal of the fourth NAND gate, an output terminal of the fourth NAND gate is connected to a second input terminal of the second NAND gate, and the output terminal of the fourth NAND gate outputs the frequency discrimination output signal.

In exemplary embodiments, the static comparator group includes N comparators that are disposed in parallel, non-inverting input terminals of the N comparators are separately connected to the frequency discrimination voltage, inverting input terminals of the N comparators are connected to the N reference voltages in a one-to-one correspondence, and an output terminal of each comparator outputs one bit of digital code.

In exemplary embodiments, the controllable current mirror includes:

a first current mirror unit, configured to generate a first current, and perform mirrored output on the first current to obtain a second current; and a second current mirror unit, including N current mirror branches that are disposed in parallel, where each current mirror branch mirrors the second current, the N current mirror branches are connected to the N bits of digital codes in a one-to-one correspondence, the digital code controls a closed/open state of the current mirror branch, and output currents of the N current mirror branches converge into the input current.

An adaptive current generation method applied to an input buffer of a high-speed ADC is provided. An input current of the input buffer is automatically adjusted based on a frequency of an input analog signal of the input buffer, and the adaptive current generation method applied to an input buffer of a high-speed ADC includes:

collecting the input analog signal, and converting the input analog signal into a first clock signal;

performing frequency division processing on the first clock signal to obtain a second clock signal;

performing frequency detection on the second clock signal to obtain a frequency discrimination output signal;

converting the frequency discrimination output signal into a frequency discrimination voltage in a direct current form;

separately comparing the frequency discrimination voltage with N reference voltages having different magnitudes to obtain N bits of digital codes; and providing a magnitude-adjustable input current for the input buffer by using a controllable current mirror under control of the N bits of digital codes, where N is an integer greater than or equal to 2.

As described above, the adaptive current generation circuit and method applied to an input buffer of a high-speed ADC in the embodiments of the present disclosure have at least the following beneficial effects:

the input analog signal of the input buffer is converted, sequentially through conversion of the inverter drive chain, frequency division of the frequency divider, frequency detection of the frequency detector, and conversion of the low-pass filter, into the frequency discrimination voltage in the direct current form that is positively correlated with a frequency of the input analog signal. Then the static comparator group performs a plurality of times of parallel comparison to obtain the N bits of digital codes. Finally, the controllable current mirror is controlled by using the N bits of digital codes. The controllable current mirror provides a magnitude-adjustable input current for the input buffer under control of the N bits of digital codes. A magnitude of the input current is positively correlated with the frequency of the input analog signal. In other words, the input current of the input buffer is adaptively adjusted based on the frequency of the input analog signal of the input buffer. This can not only effectively avoid a waste of power consumption caused by an excessively large input current, but also avoid performance degradation caused by an excessively large input current or an excessively small input current.

BRIEF DESCRIPTION OF DRAWINGS

FIG. 1 is a basic circuit diagram of a source follower in prior art;

FIG. 2 is a circuit diagram of an adaptive current generation circuit applied to an input buffer of a high-speed ADC according to an embodiment of the present disclosure;

FIG. 3 is a circuit diagram of an inverter drive chain in FIG. 2;

FIG. 4 is a circuit diagram of a frequency divider in FIG. 2;

FIG. 5 is a circuit diagram of a frequency detector in FIG. 2;

FIG. 6 is a circuit diagram of a conventional common edge-triggered phase frequency detector in prior art;

DESCRIPTION OF EMBODIMENTS

Figure 7:
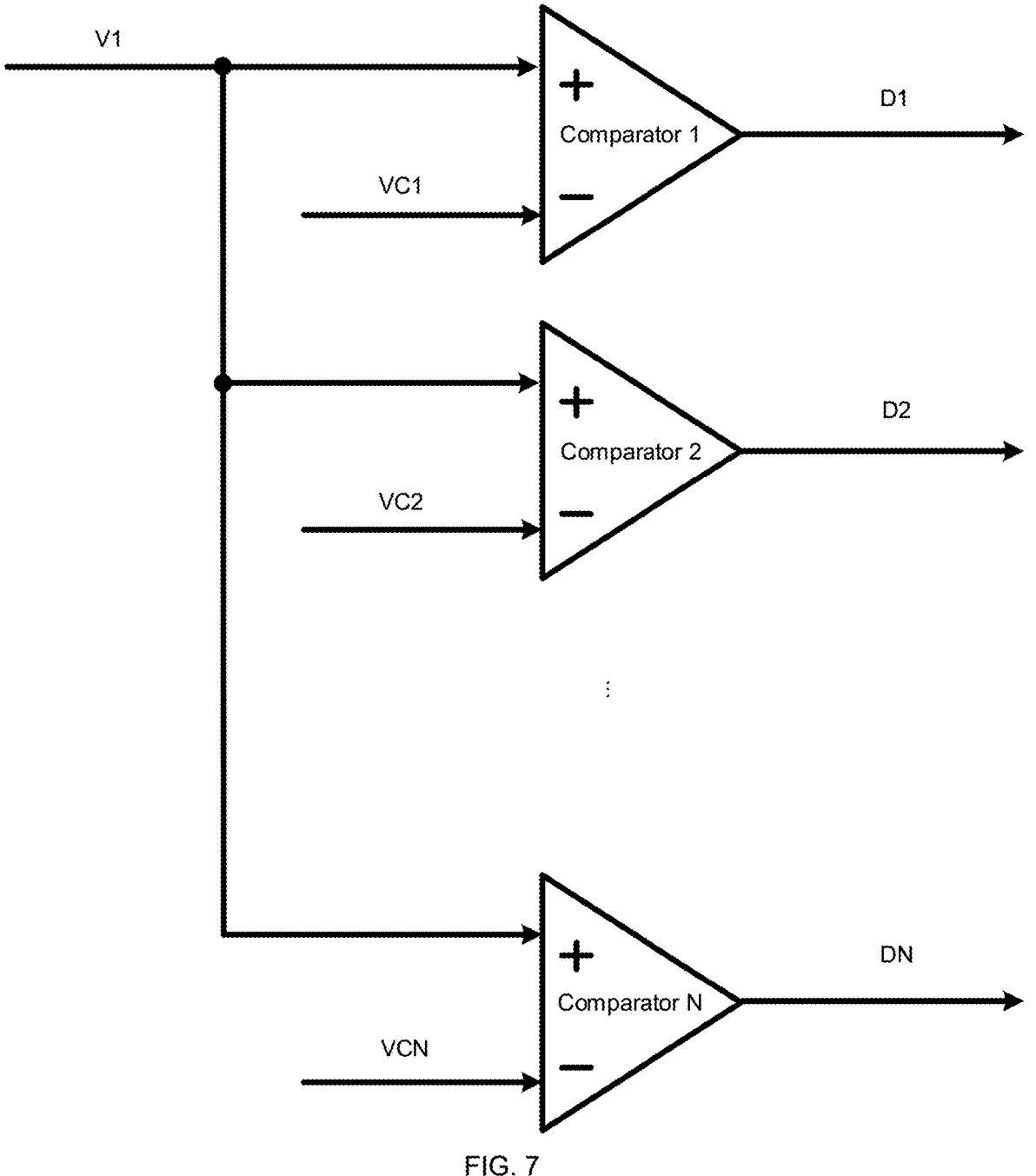
FIG. 7 is a circuit diagram of a static comparator group in FIG. 2.

The following describes implementations of the present disclosure by using some specific examples. A person skilled in the art can easily understand other advantages and effects of the present disclosure based on the content disclosed in this specification. The present disclosure may be further implemented or applied by using other different specific implementations. Various details in this specification may also be modified or altered based on different viewpoints and applications without departing from the present disclosure.

Refer to FIG. 1 to FIG. 10. It should be noted that the drawings provided in the embodiments merely describe the basic concept of the present disclosure by using examples. Although the drawings show only components related to the present disclosure, and are not drawn based on a quantity of components, a shape of a component, and a size of a component during actual implementation, a shape, a quantity, and a scale of the components may be arbitrarily changed during actual implementation, and a component layout form may be more complex. The structure, scale, size, and the like shown in the drawings of this specification are merely used to cooperate with the content disclosed in this specification for a person skilled in the art to understand and read, and are not restrictions for limiting implementation of the present disclosure, and therefore have no technically substantial significance. Any modification of the structure, change of a proportional relationship, or adjustment of the size shall still fall within the scope that can be covered by the technical content disclosed in the present disclosure, provided that they do not affect the efficacy that can be generated by the present disclosure and the purpose that can be achieved by the present disclosure.

As described in the background, the inventors have found through research that in recent years, both the military market and the civilian market have a huge demand for ultra-high-speed ADCs, and input buffers are widely used in the ultra-high-speed ADCs to preprocess input signals because the input buffers have functions of driving capability enhancement and packaging parasitism suppression. The input buffer usually uses a source follower as a basic structure thereof. A basic circuit of the source follower in prior art is shown in FIG. 1. The source follower includes two NMOS transistors: a source follower transistor N1 and a current mirror transistor N2. A source of N1 is connected to a drain of N2, and the connecting point also serves as an output terminal $V_{OUT}$. A drain of N1 is connected to a power supply VDD, a source of N2 is grounded, a gate of N1 is connected to an input analog signal $V_{IN}$, and a gate of N2 is connected to an input current source signal $I_{IN}$. The structure has high input impedance and low output impedance. In addition, because the current source signal $I_{IN}$ can be adjusted to be large, the output terminal $V_{OUT}$ has a strong driving capability. This helps drive a sampling circuit and improves performance of the sampling circuit.

However, the input buffer using the source follower as the basic structure has a disadvantage that the input buffer needs different current values for input signals with different frequencies. For a low-frequency input signal, the input buffer can work normally even with a small current. However, for a high input frequency, a large current needs to be provided for the input buffer to ensure performance thereof. A large current is usually directly provided for a conventional input buffer to ensure performance in the case of a high-frequency input signal. Consequently, when an input signal is a low-frequency signal, an excessively large current wastes a lot of power consumption, and performance is degraded to different extents because a quiescent operating point is affected by the large current compared with that in the case of a small current. In addition, in some input buffers, manual adjustment is performed to avoid this problem, that is, a user adjusts a magnitude of a current based on a frequency of an input signal. However, this increases the difficulty of use. Therefore, it is inconvenient for the user to use the input buffer, and practicality is affected.

Based on this, the present disclosure provides an adaptive current generation technical solution applied to an input buffer of a high-speed ADC. An input current of the input buffer is adaptively adjusted based on a frequency of an input analog signal of the input buffer. In an embodiment, first, the input analog signal of the input buffer is converted into a frequency discrimination voltage in a direct current form that is positively correlated with the frequency of the input analog signal, then the frequency discrimination voltage is compared with a plurality of reference voltages having different magnitudes to obtain a plurality of bits of digital codes, and finally, a controllable current mirror is controlled by using the plurality of bits of digital codes. The controllable current mirror provides a magnitude-adjustable input current for the input buffer, and a magnitude of the input current is positively correlated with the frequency of the input analog signal, to implement adaptive adjustment.

First, as shown in FIG. 2, the present disclosure provides an adaptive current generation circuit applied to an input buffer of a high-speed ADC. The circuit includes:

an inverter drive chain, configured to collect an input analog signal $V_{IN}$ of the input buffer, and convert the input analog signal $V_{IN}$ into a first clock signal CLK1;

a frequency divider, configured to receive the first clock signal CLK1, and perform frequency division processing on the first clock signal CLK1 to obtain a second clock signal CLK2;

a frequency detector, configured to receive a reference clock signal CLKR and the second clock signal CLK2, and perform frequency detection on the second clock signal CLK2 to obtain a frequency discrimination output signal CLK3;

a low-pass filter, configured to receive the frequency discrimination output signal CLK3, and convert the frequency discrimination output signal CLK3 into a frequency discrimination voltage V1 in a direct current form;

a static comparator group, configured to receive the frequency discrimination voltage V1 and N reference voltages VC1 to VCN having different magnitudes, and separately compare the frequency discrimination voltage V1 with the N reference voltages VC1 to VCN to obtain N bits of digital codes D1 to DN; and a controllable current mirror, configured to receive the N bits of digital codes D1 to DN, and provide a magnitude-adjustable input current $I_{IN}$ for the input buffer under control of the N bits of digital codes D1 to DN, where N is an integer greater than or equal to 2.

In an embodiment, as shown in FIG. 3, the inverter drive chain includes:

a first inverting unit, connected to one terminal $V_{IN+}$ of the input analog signal $V_{IN}$, and configured to perform inverting M consecutive times to obtain and output the first clock signal CLK1; and a second inverting unit, connected to the other terminal $V_{IN-}$ of the input analog signal $V_{IN}$, and configured to perform inverting once, to be floating without output, where M is an integer greater than or equal to 2, and the input analog signal $V_{IN}$ is a differential signal, two terminals of which are $V_{IN+}$ and $V_{IN-}$, respectively.

In an embodiment, as shown in FIG. 3, the inverter drive chain includes two parts: the first inverting unit and the second inverting unit. The first inverting unit includes M sequentially cascaded (serially connected) CMOS inverters, and is connected to the one terminal $V_{IN+}$ of the input analog signal $V_{IN}$. The first inverting unit is used to convert the analog input signal $V_{IN}$ into the easy-to-process first clock signal CLK1 by using an inverter chain, while retaining frequency information of the analog input signal $V_{IN}$. The second inverting unit includes only one CMOS inverter, and is connected to the other terminal $V_{IN-}$ of the input analog signal $V_{IN}$. After passing through the one-stage inverter, the other terminal of the input analog signal $V_{IN}$ directly does not need to connect to a back-stage inverter, and an output can be directly floating, because the second inverting unit is merely used to match and simulate load of input signals (differential signals) of the two terminals to ensure that the load of the two terminals $V_{IN+}$ and $V_{IN-}$ is the same and keeps matched. Only in this way, can consistency between the input signals of the two terminals be ensured to a greatest extent, so that performance degradation caused by inconsistency is avoided.

In an embodiment, as shown in FIG. 3, in the first inverting unit, inverters constituting the inverter chain include NMOS transistors and PMOS transistors with different width to length ratios. Width to length ratios of a PMOS transistor P1 and an NMOS transistor N1 in the first CMOS inverter are respectively denoted as W_P/L_P and W_N/L_N. The size is usually small, to reduce an input parasitic capacitance of the first CMOS inverter, ensuring that the first CMOS inverter does not greatly affect a driving capability of the input analog signal $V_{IN}$ and degrade performance of the ADC. After passing through the first CMOS inverter, the one terminal $V_{IN+}$ of the input analog signal $V_{IN}$ continues to pass through the second CMOS inverter, the third CMOS inverter, . . . , and an $M^{th}$ CMOS inverter, so that inverting is performed M times to obtain and output the first clock signal CLK1. A value of M is not limited, and is usually 4 or 5 to achieve a proper driving capability.

In addition, in the first inverting unit, width to length ratios of CMOS inverters following the first CMOS inverter increase proportionally to enhance a driving capability of an output signal. That is, width to length ratios of PMOS transistors in the M sequentially cascaded CMOS inverters are distributed in a geometric progression by using S as a common ratio, and width to length ratios of NMOS transistors in the M sequentially cascaded CMOS inverters are distributed in a geometric progression by using S as a common ratio, where S is an integer greater than or equal to 2.

In an optional embodiment of the present disclosure, a value of S is 2, that is, width to length ratios of a PMOS transistor P2 and an NMOS transistor N2 in the second CMOS inverter in the first inverting unit are respectively 2*W_P/L_P and 2*W_N/L_N, width to length ratios of a PMOS transistor P3 and an NMOS transistor N3 in the third CMOS inverter in the first inverting unit are respectively $2^2$*W_P/L_P and $2^2$*W_N/L_N, and width to length ratios of a PMOS transistor $P_M$ and an NMOS transistor $N_M$ in the $M^{th}$ CMOS inverter in the first inverting unit are respectively $$\frac{2^{M-1}*W\_P}{L\_P}$$

and $$\frac{2^{M-1}*W\_N}{L\_N}.$$

In an embodiment, as shown in FIG. 4, the frequency divider includes L sequentially cascaded D flip-flops, a forward output terminal Q of an $i^{th}$ D flip-flop is connected to a clock terminal of an $(i+1)^{th}$ D flip-flop, a reverse output terminal QN of a $j^{th}$ D flip-flop is connected to an input terminal Din of the $j^{th}$ D flip-flop, a clock terminal of the first D flip-flop is connected to the first clock signal CLK1, and a forward output terminal Q of an Lth D flip-flop outputs the second clock signal CLK2, where L is an integer greater than or equal to 2, i is an integer ranging from 1 to L−1, and j is an integer ranging from 1 to L.

The frequency divider is formed by cascading the L D flip-flops, and the quantity L is determined based on a needed frequency division factor. The first clock signal CLK1 is input from the clock terminal of the first D flip-flop (namely, a D flip-flop 1), a forward output terminal Q thereof is connected to a clock terminal of a next D flip-flop, and a reverse output terminal QN thereof is connected to a (data) input terminal Din of the current flip-flop. By analogy, a forward output of the last D flip-flop (namely, a D flip-flop L) is an output signal, namely, the second clock signal CLK2 obtained after frequency division.

In an embodiment, as shown in FIG. 4, the frequency divider includes cascaded D flip-flops. The frequency divider is used to perform frequency division on the first clock signal CLK1 with a higher frequency to obtain the second clock signal CLK2 with a lower frequency. Because the frequency divider includes cascaded D flip-flops, the quantity L of D flip-flops inside the frequency divider determines a frequency division degree. The frequency division degree depends on a maximum frequency of the input analog signal $V_{IN}$ and a frequency of the reference clock signal CLKR in the frequency detector. Because the frequency of the reference clock signal CLKR in the frequency detector is usually small, and the frequency detector can work normally only when a frequency of a to-be-detected clock signal (namely, the second clock signal CLK2) is less than half of the frequency of the reference clock signal CLKR, the frequency divider needs to perform frequency division on the converted first clock signal CLK1 to obtain a signal whose frequency is less than or equal to half of the frequency of the reference clock signal CLKR, in other words, the frequency of the second clock signal CLK2 needs to be less than or equal to half of the frequency of the reference clock signal CLKR, to ensure subsequent normal working of the circuit.

In an embodiment, as shown in FIG. 5, the frequency detector includes a logic gate circuit. The frequency detector is used to detect the frequency of the input second clock signal CLK2 and output a signal whose duty cycle varies with a frequency of an input signal (namely, the second clock signal CLK2), to implement frequency detection. Input signals of the frequency detector are the second clock signal CLK2 provided by the frequency divider and the reference clock signal CLKR provided by an external clock circuit. An output signal of the frequency detector is the frequency discrimination output signal CLK3, and a duty cycle of the signal is related to the frequency of the second clock signal CLK2.

In an embodiment, as shown in FIG. 5, the frequency detector includes a first inverter T1, a second inverter T2, a third inverter T3, a delay inverter chain, a NOR gate U1, a first NAND gate U2, a second NAND gate U3, a third NAND gate U4, a fourth NAND gate U5, and an RS flip-flop RS1, an input terminal of the first inverter T1 is connected to the reference clock signal CLKR, an output terminal of the first inverter T1 is connected to a first input terminal of the first NAND gate U2, an output terminal of the first NAND gate U2 is connected to a first input terminal of the NOR gate U1, an output terminal of the NOR gate U1 is connected to a second input terminal of the first NAND gate U2 through the second inverter T2, the delay inverter chain, and the third inverter T3 that are sequentially connected in series, a first input terminal of the second NAND gate U3 is connected to the second clock signal CLK2, an output terminal of the second NAND gate U3 is connected to a direct-set terminal of the RS flip-flop RS1, the output terminal of the second NAND gate U3 is further connected to a first input terminal of the third NAND gate U4 and a first input terminal of the fourth NAND gate U5, a direct-reset terminal of the RS flip-flop RS1 is connected to the second input terminal of the first NAND gate U2, a forward output terminal of the RS flip-flop RS1 is connected to a second input terminal of the third NAND gate U4, an output terminal of the third NAND gate U4 is connected to a second input terminal of the NOR gate U1, the forward output terminal of the RS flip-flop RS1 is further connected to a second input terminal of the fourth NAND gate U5, an output terminal of the fourth NAND gate U5 is connected to a second input terminal of the second NAND gate U3, and the output terminal of the fourth NAND gate U5 outputs the frequency discrimination output signal CLK3.

In an embodiment, the frequency detector shown in FIG. 5 is obtained by improving a conventional common edge-triggered phase frequency detector shown in FIG. 6. The conventional common edge-triggered phase frequency detector also includes a logic gate circuit, a flip-flop is an RS flip-flop, and a delay of a RESET signal is increased by using a delay inverter chain. The inverter chain may be a chain with a fixed quantity of inverters, or may be a chain with an adjustable number of inverters, and the inverter chain is used to suppress a dead zone phenomenon of the phase frequency detector. As shown in FIG. 6, signals output by the conventional structure are a UP signal and a DOWN signal, and the UP signal and the DOWN signal jointly reflect a frequency difference and a phase difference between the to-be-detected second clock signal CLK2 and the reference clock signal CLKR, to implement a phase frequency detection function. This is necessary for a phase-locked loop in which a phase and a frequency of a signal need to be accurately controlled. However, in the present disclosure, only a frequency relationship between the second clock signal CLK2 obtained after frequency division and the reference clock signal CLKR needs to be determined, and it can be ensured that the frequency of the second clock signal CLK2 obtained after frequency division is less than half of the frequency of the reference clock signal CLKR. Therefore, the conventional common edge-triggered phase frequency detector shown in FIG. 6 is not applicable to the present disclosure.

Therefore, to resolve the inapplicable problem of the conventional common edge-triggered phase frequency detector, the present disclosure provides a frequency detector circuit, and a circuit diagram of the frequency detector circuit is shown in FIG. 5. As shown in FIG. 5 and FIG. 6, the frequency detector in the present disclosure and the conventional common edge-triggered phase frequency detector have the following differences: (1) A fifth NAND gate U6 using the reference clock signal CLKR and the UP signal as inputs is replaced with the first inverter T1 using the reference clock signal CLKR as an input. (2) An UP output terminal, a sixth NAND gate U7 that generates the UP signal, and a seventh NAND gate U8 are removed. (3) An RS flip-flop RS2 is removed, and two input signals originally output to the RS flip-flop structure RS2 are changed to an output of the first inverter T1 using the reference clock signal CLKR as an input and a RESET signal which are output to the first NAND gate U2.

In an embodiment, the frequency detector shown in FIG. 5 may output frequency discrimination output signals CLK3 with different duty cycles, and the duty cycle of the frequency discrimination output signal CLK3 monotonously varies with the frequency of the input second clock signal CLK2, that is, a higher frequency of the input second clock signal CLK2 indicates a larger duty cycle of the frequency discrimination output signal CLK3, or a higher frequency of the input second clock signal CLK2 indicates a smaller duty cycle of the frequency discrimination output signal CLK3, to implement a frequency detection function.

In an embodiment, the low-pass filter may include an analog low-pass filter. An input signal of the low-pass filter is the frequency discrimination output signal CLK3 output by the frequency detector, and an output signal of the low-pass filter is the frequency discrimination voltage V1. The low-pass filter is used to convert frequency discrimination output signals CLK3 with different duty cycles into direct current voltage signals, namely, frequency discrimination voltages V1, that is, a magnitude of the frequency discrimination voltage V1 is positively correlated with the duty cycle of the frequency discrimination output signal CLK3, in other words, a larger duty cycle of the frequency discrimination output signal CLK3 indicates a larger frequency discrimination voltage V1. The low-pass filter may include a first-order filter or a higher-order filter. If a filter with a higher order is used, signal jitter of an output frequency discrimination voltage V1 is smaller.

In an embodiment, as shown in FIG. 7, the static comparator group includes N comparators (namely, a comparator 1 to a comparator N) that are disposed in parallel. The quantity N of comparators (or the quantity of reference voltages) is determined by a resolution of current adjustment. If more precise current adjustment is needed, the quantity N of comparators may be increased. Non-inverting input terminals of the N comparators are separately connected to the frequency discrimination voltage V1, and inverting input terminals of the N comparators are connected to the N reference voltages VC1 to VCN in a one-to-one correspondence. An output terminal of each comparator outputs one bit of digital code, and an output terminal of a comparator k outputs a digital code Dk, where k is an integer ranging from 1 to N.

In an embodiment, as shown in FIG. 7, the static comparator group includes static comparators. A quantity of static comparators depends on the quantity of reference voltages. The reference voltages VC1 to VCN are usually sorted in ascending order or in descending order of magnitudes. The frequency discrimination voltage V1 is separately compared with the reference voltages VC1 to VCN having different magnitudes to obtain different comparison results. The results are N bits of digital codes (or thermometer codes). A voltage range to which the frequency discrimination voltage V1 belongs depends on a quantity of 0s or 1s in the digital codes, and this is used as a basis for performing subsequent input current adjustment. To suppress jitter of the frequency discrimination voltage V1 output by the low-pass filter, the comparator may be designed as a hysteresis comparator, to avoid impact of the jitter on the comparison result.

Figure 8:
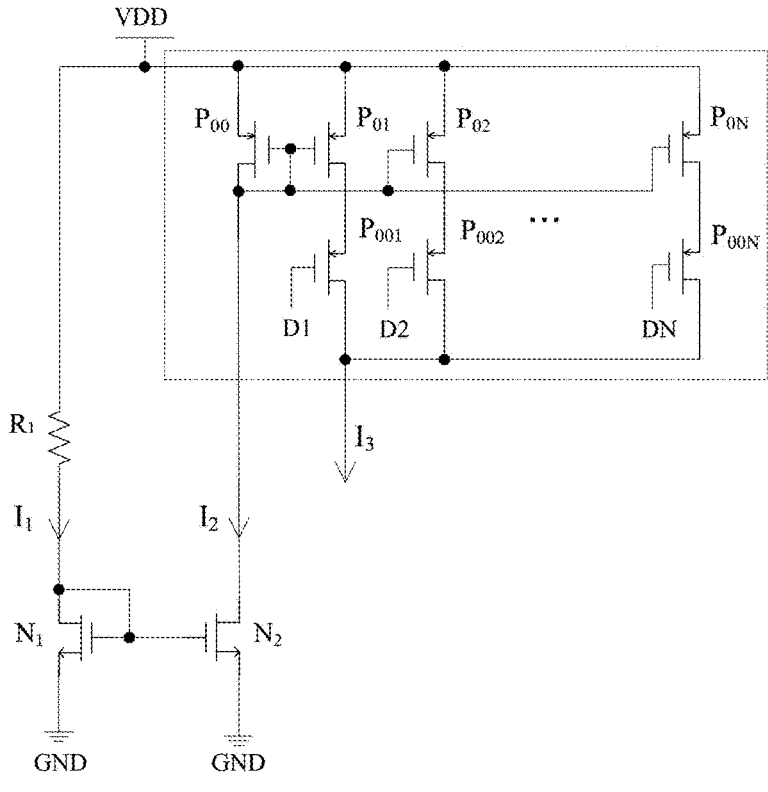
FIG. 8 is a circuit diagram of a controllable current mirror in FIG. 2.

In an embodiment, as shown in FIG. 8, the controllable current mirror is mainly based on a common cascode current mirror structure and a control switch, and the control switch controls a magnitude of an output current based on the comparison result of the static comparator group, to implement output of currents having different magnitudes, in other words, provide input currents $I_{IN}$ having different magnitudes for the input buffer.

In an embodiment, in an optional embodiment of the present disclosure, as shown in FIG. 8, the controllable current mirror includes:

a first current mirror unit, configured to generate a first current $I_1$, and perform mirrored output on the first current $I_1$ to obtain a second current $I_2$; and a second current mirror unit, including N current mirror branches that are disposed in parallel, where each current mirror branch mirrors the second current $I_2$, the N current mirror branches are connected to the N bits of digital codes D1 to DN in a one-to-one correspondence, the digital code Dk controls a closed/open state of a corresponding current mirror branch, output currents of the N current mirror branches converge into a third current $I_3$, and the third current Is is the input current $I_{IN}$ of the input buffer.

As shown in FIG. 8, the first current mirror unit includes a resistor $R_1$, an NMOS transistor $N_1$, and an NMOS transistor $N_2$, and the NMOS transistor $N_1$ and the NMOS transistor $N_2$ constitute a cascode current mirror. A power supply VDD is connected to a ground GND after passing through the resistor $R_1$ and the NMOS transistor $N_1$ that are sequentially connected in series, to form a current loop and generate the first current $I_1$. The current mirror including NMOS transistor $N_1$ and the NMOS transistor $N_2$ performs mirrored output on the first current $I_1$ to obtain the second current $I_2$ at a drain of the NMOS transistor $N_2$. The second current mirror unit includes the N current mirror branches that are disposed in parallel. A PMOS transistor $P_{00}$ and a PMOS transistor $P_{01}$ constitute a first current mirror branch, an output of the current mirror branch is controlled by a PMOS transistor $P_{001}$, and a gate of the PMOS transistor $P_{001}$ is connected to the digital code D1. The PMOS transistor $P_{00}$ and a PMOS transistor $P_{02}$ constitute a second current mirror branch, an output of the current mirror branch is controlled by a PMOS transistor $P_{002}$, and a gate of the PMOS transistor $P_{002}$ is connected to the digital code D2. By analogy, the PMOS transistor $P_{00}$ and a PMOS transistor $P_{0N}$ constitute an $N^{th}$ current mirror branch, an output of the current mirror branch is controlled by a PMOS transistor $P_{00N}$, and a gate of the PMOS transistor $P_{00N}$ is connected to the digital code DN. The digital code Dk controls the closed/open state of the corresponding current mirror branch. The output currents of the N current mirror branches converge into the input current $I_{IN}$ (namely, the third current $I_3$) of the input buffer.

It should be noted that one bit of digital code can alternatively control closed/open states of two or more current mirror branches, to simplify a circuit structure. Current mirror magnification multiples of the N current mirror branches that are disposed in parallel in the second current mirror unit may be adjusted as appropriate, for example, may increase or decrease proportionally, to further simplify the circuit structure. Details are not described herein.

In an optional embodiment of the present disclosure, to verify a technical effect of the foregoing adaptive current generation circuit applied to an input buffer of a high-speed ADC, in a 28 nm CMOS process, the foregoing adaptive current generation circuit applied to an input buffer of a high-speed ADC is used for an input buffer of a high-speed ADC. Frequency bandwidth of an input analog signal $V_{IN}$ of the input buffer of the high-speed ADC is 4 G (in other words, a frequency range of the input signal is DC-4 GHZ).

It is determined, based on the foregoing indicator, that there are five CMOS inverters in the first inverting unit in the inverter drive chain, and there are three D flip-flops in the frequency divider, in other words, divided-by-8 frequency division is performed. In this way, a maximum frequency of a clock signal obtained after frequency division is 500 MHz. Therefore, 1 G is selected as the frequency of the reference clock signal CLKR, to ensure that the frequency of the reference clock signal CLKR is at least twice the frequency of the second clock signal CLK2 obtained after frequency division. In addition, a quantity of inverters is adjusted, so that a smaller frequency of the second clock signal CLK2 obtained after frequency division leads to a smaller duty cycle of a signal output by the frequency detector. The low-pass filter can be a first-order RC low-pass filter, and a cut-off frequency is 1 MHz. There are three comparators in the static comparator group, three corresponding reference voltages are 790 mV, 880 mV, and 940 mV, respectively, and corresponding frequencies are 800 MHZ, 1.5 GHZ, and 2.5 GHz. In this case, there are four cases for the comparison result of the comparator: 000, 001, 011, and 111, which respectively correspond to magnitudes of four input currents, and the magnitudes of the four input currents are 400 μA, 600 μA, 1.2 mA, and 1.5 mA, respectively.

When a frequency of the input analog signal $V_{IN}$ is less than 800 MHZ, a current source current of 400 μA is used as the input current of the input buffer; when the frequency of the input analog signal $V_{IN}$ falls between 800 MHZ and 1.5 GHZ, a current source current of 600 μA is used as the input current of the input buffer; when the frequency of the input analog signal $V_{IN}$ falls between 1.5 GHZ and 2.5 GHZ, a current source current of 1.2 mA is used as the input current of the input buffer; and when the frequency of the input analog signal $V_{IN}$ is above 2.5 GHZ, a current source current of 1.5 mA is used as the input current of the input buffer.

Figure 9:
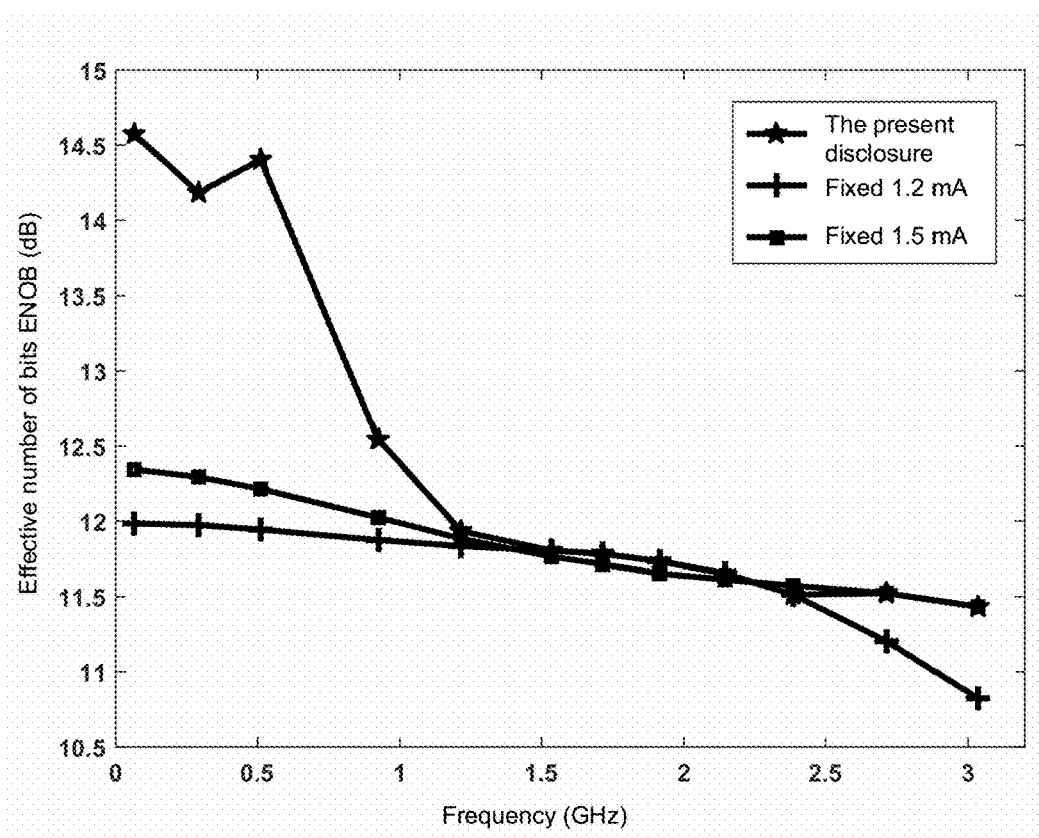
FIG. 9 is a schematic diagram of simulation results of effective numbers of bits of output signals of input buffers using different input current solutions in cases of input analog signals with different frequencies according to an embodiment of the present disclosure.
Figure 10:
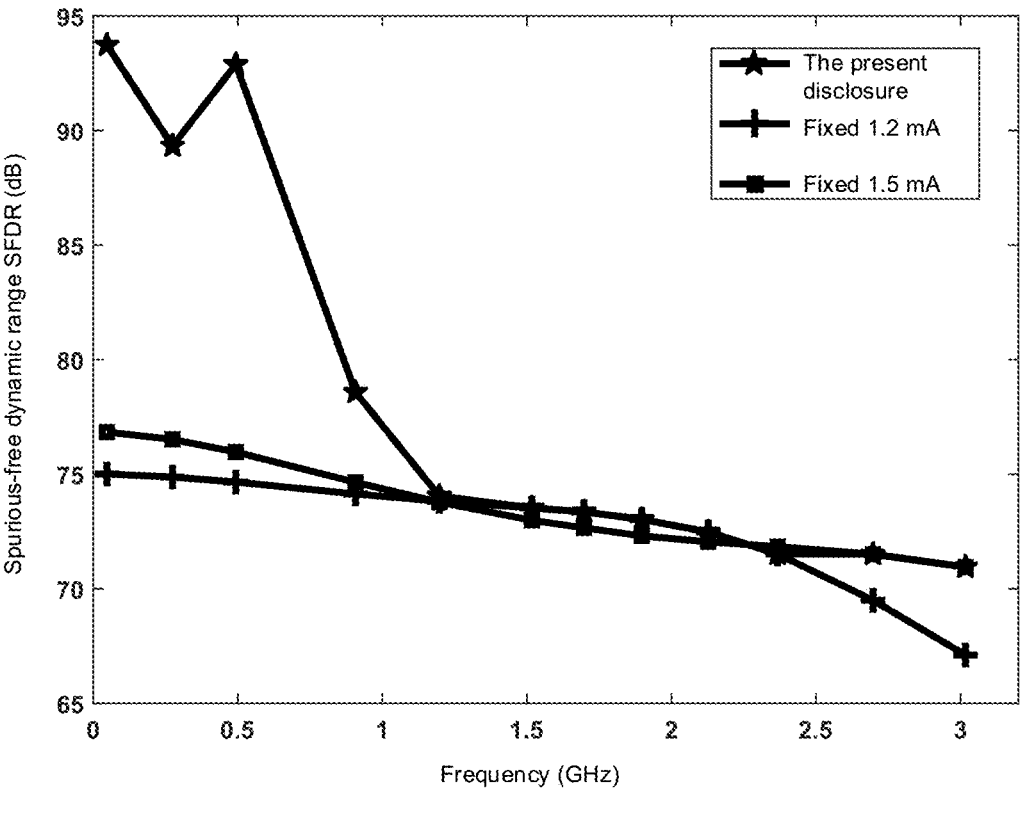
FIG. 10 is a schematic diagram of simulation results of spurious-free dynamic ranges of output signals of input buffers using different input current solutions in cases of input analog signals with different frequencies according to an embodiment of the present disclosure.

The foregoing circuit is constructed, and simulation is performed. For comparison, an input buffer using a fixed current of 1.2 mA and an input buffer using a fixed current of 1.5 mA are further added. Simulation results are shown in FIG. 9 and FIG. 10. It can be clearly found that, compared with using a current source with a fixed current, using the adaptive current generation circuit in the present disclosure can achieve good performance at all frequencies, a larger effective number of bits (ENOB) and spurious-free dynamic range (SFDR) of an output signal of the input buffer, and great improvements in various performance indicators of the output signal of the input buffer when the frequency of the input analog signal $V_{IN}$ is less than 800 MHZ. Therefore, the adaptive current generation circuit in the present disclosure can achieve low power consumption and good performance in the case of an input analog signal $V_{IN}$ with a low frequency. In addition, the entire current adjustment is automatic without requiring a user to perform adjustment, which makes it easy for the user to use the circuit.

In addition, on the basis of the same design concept as the foregoing adaptive current generation circuit applied to an input buffer of a high-speed ADC, the present disclosure further provides an adaptive current generation method applied to an input buffer of a high-speed ADC. An input current of the input buffer is automatically adjusted based on a frequency of an input analog signal of the input buffer, and the adaptive current generation method applied to an input buffer of a high-speed ADC includes the following steps:

S1: Collect the input analog signal, and convert the input analog signal into a first clock signal.

S2: Perform frequency division processing on the first clock signal to obtain a second clock signal.

S3: Perform frequency detection on the second clock signal to obtain a frequency discrimination output signal.

S4: Convert the frequency discrimination output signal into a frequency discrimination voltage in a direct current form.

S5: Separately compare the frequency discrimination voltage with N reference voltages having different magnitudes to obtain N bits of digital codes.

S6: Provide a magnitude-adjustable input current for the input buffer by using a controllable current mirror under control of the N bits of digital codes.

N is an integer greater than or equal to 2. For a specific implementation process of steps S1 to S6, refer to the working principle of the foregoing adaptive current generation circuit applied to an input buffer of a high-speed ADC. Details are not described herein again.

In conclusion, in the adaptive current generation circuit and method applied to an input buffer of a high-speed ADC provided in the present disclosure, the input analog signal of the input buffer is converted, sequentially through conversion of the inverter drive chain, frequency division of the frequency divider, frequency detection of the frequency detector, and conversion of the low-pass filter, into the frequency discrimination voltage in the direct current form that is positively correlated with the frequency of the input analog signal. Then the static comparator group performs a plurality of times of parallel comparison to obtain the N bits of digital codes. Finally, the controllable current mirror is controlled by using the N bits of digital codes. The controllable current mirror provides a magnitude-adjustable input current for the input buffer under control of the N bits of digital codes. A magnitude of the input current is positively correlated with the frequency of the input analog signal. In other words, in the present disclosure, the input current of the input buffer is adaptively adjusted based on the frequency of the input analog signal of the input buffer. This can not only effectively avoid a waste of power consumption caused by an excessively large input current, but also avoid performance degradation caused by an excessively large input current or an excessively small input current.

The foregoing embodiments merely illustrate principles and effects of the present disclosure, but are not intended to limit the present disclosure. Any person skilled in the art may modify or alter the foregoing embodiments without departing from the scope of the present disclosure. Therefore, all equivalent modifications or alterations completed by a person of ordinary skill in the art without departing from the technical ideas disclosed in the present disclosure shall still be covered by the claims of the present disclosure.

What is claimed is:

1. An adaptive current generation circuit, applied to an input buffer of a high-speed ADC, comprising:

an inverter drive chain, configured to collect an input analog signal of the input buffer, and convert the input analog signal into a first clock signal;

a frequency divider, configured to receive the first clock signal, and perform frequency division processing on the first clock signal to obtain a second clock signal;

a frequency detector, configured to receive a reference clock signal and the second clock signal, and perform frequency detection on the second clock signal to obtain a frequency discrimination output signal;

a low-pass filter, configured to receive the frequency discrimination output signal, and convert the frequency discrimination output signal into a frequency discrimination voltage in a direct current form;

a static comparator group, configured to receive the frequency discrimination voltage and N reference voltages having different magnitudes, and separately compare the frequency discrimination voltage with the N reference voltages to obtain N bits of digital codes; and a controllable current mirror, configured to receive the N bits of the digital codes, and provide a magnitude-adjustable input current for the input buffer under control of the N bits of the digital codes, wherein N is an integer greater than or equal to 2.

2. The adaptive current generation circuit according to claim 1, wherein the inverter drive chain comprises:

a first inverting unit, connected to a first terminal of the input analog signal, and configured to perform inverting M consecutive times to obtain and output the first clock signal; and a second inverting unit, connected to a second terminal of the input analog signal, and configured to perform inverting once, to be suspended without output, wherein M is an integer greater than or equal to 2.

3. The adaptive current generation circuit according to claim 2, wherein the first inverting unit comprises M sequentially cascaded CMOS inverters, and the second inverting unit comprises one CMOS inverter.

4. The adaptive current generation circuit according to claim 3, wherein in the first inverting unit, width to length ratios of NMOS transistors in the M sequentially cascaded CMOS inverters are distributed in a geometric progression by using S as a common ratio, and width to length ratios of PMOS transistors in the M sequentially cascaded CMOS inverters are distributed in a geometric progression by using S as a common ratio, wherein S is an integer greater than or equal to 2.

5. The adaptive current generation circuit according to claim 4, wherein the frequency divider comprises L sequentially cascaded D flip-flops, a forward output terminal of an $i^{th}$ D flip-flop is connected to a clock terminal of an $(i+1)^{th}$ D flip-flop, a reverse output terminal of a $j^{th}$ D flip-flop is connected to an input terminal of the $j^{th}$ D flip-flop, a clock terminal of the first D flip-flop is connected to the first clock signal, and a forward output terminal of an Lth D flip-flop outputs the second clock signal, wherein L is an integer greater than or equal to 2, i is an integer ranging from 1 to L−1, and j is an integer ranging from 1 to L.

6. The adaptive current generation circuit according to claim 5, wherein a frequency of the second clock signal is less than or equal to half of a frequency of the reference clock signal.

7. The adaptive current generation circuit according to claim 6, wherein the frequency detector comprises a first inverter, a second inverter, a third inverter, a delay inverter chain, a NOR gate, a first NAND gate, a second NAND gate, a third NAND gate, a fourth NAND gate, and an RS flip-flop, an input terminal of the first inverter is connected to the reference clock signal, an output terminal of the first inverter is connected to a first input terminal of the first NAND gate, an output terminal of the first NAND gate is connected to a first input terminal of the NOR gate, an output terminal of the NOR gate is connected to a second input terminal of the first NAND gate after passing through the second inverter, the delay inverter chain, and the third inverter that are sequentially connected in series, a first input terminal of the second NAND gate is connected to the second clock signal, an output terminal of the second NAND gate is connected to a direct-set terminal of the RS flip-flop, the output terminal of the second NAND gate is further connected to a first input terminal of the third NAND gate and a first input terminal of the fourth NAND gate, a direct-reset terminal of the RS flip-flop is connected to the second input terminal of the first NAND gate, a forward output terminal of the RS flip-flop is connected to a second input terminal of the third NAND gate, an output terminal of the third NAND gate is connected to a second input terminal of the NOR gate, the forward output terminal of the RS flip-flop is further connected to a second input terminal of the fourth NAND gate, an output terminal of the fourth NAND gate is connected to a second input terminal of the second NAND gate, and the output terminal of the fourth NAND gate outputs the frequency discrimination output signal.

8. The adaptive current generation circuit according to claim 7, wherein the static comparator group comprises N comparators that are disposed in parallel, non-inverting input terminals of the N comparators are separately connected to the frequency discrimination voltage, inverting input terminals of the N comparators are connected to the N reference voltages in a one-to-one correspondence, and an output terminal of each comparator outputs one bit of digital code.

9. The adaptive current generation circuit according to claim 8, wherein the controllable current mirror comprises:

a first current mirror unit, configured to generate a first current, and perform mirrored output on the first current to obtain a second current; and a second current mirror unit, comprising N current mirror branches that are disposed in parallel, wherein each current mirror branch mirrors the second current, the N current mirror branches are connected to the N bits of digital codes in a one-to-one correspondence, the digital code controls a closed/open state of the current mirror branch, and output currents of the N current mirror branches converge into the input current.

10. An adaptive current generation method, applied to an input buffer of a high-speed ADC, wherein an input current of the input buffer is automatically adjusted based on a frequency of an input analog signal of the input buffer, and the adaptive current generation method comprises:

collecting the input analog signal, and converting the input analog signal into a first clock signal;

performing frequency division processing on the first clock signal to obtain a second clock signal;

performing frequency detection on the second clock signal to obtain a frequency discrimination output signal;

converting the frequency discrimination output signal into a frequency discrimination voltage in a direct current form;

separately comparing the frequency discrimination voltage with N reference voltages having different magnitudes to obtain N bits of digital codes; and providing a magnitude-adjustable input current for the input buffer by using a controllable current mirror under control of the N bits of digital codes, wherein N is an integer greater than or equal to 2.

* * * * *